(12) United States Patent
Camacho et al.

(10) Patent No.: US 7,998,790 B2
(45) Date of Patent: Aug. 16, 2011

(54) INTEGRATED CIRCUIT PACKAGING SYSTEM WITH ISOLATED PADS AND METHOD OF MANUFACTURE THEREOF

(75) Inventors: Zigmund Ramirez Camacho, Singapore (SG); Henry Descalzo Bathan, Singapore (SG); Lionel Chien Hui Tay, Singapore (SG); Jose Alvin Caparas, Singapore (SG)

(73) Assignee: Stats Chippac Ltd., Singapore (SG)

( * ) Notice: Subject to any disclaimer, the term of this patent is extended or adjusted under 35 U.S.C. 154(b) by 74 days.

(21) Appl. No.: 12/474,757

(22) Filed: May 29, 2009

(65) Prior Publication Data

US 2009/0302442 A1 Dec. 10, 2009

Related U.S. Application Data

(60) Provisional application No. 61/057,203, filed on May 30, 2008.

(51) Int. Cl.
*H01L 21/00* (2006.01)
(52) U.S. Cl. ........... 438/111; 438/112; 257/E21.502; 257/E21.51; 361/813; 216/14

(58) Field of Classification Search ........... 257/E21.502, 257/E21.506, E21.51, E21.587, E23.031; 438/111, 112; 216/14; 29/827; 361/813
See application file for complete search history.

(56) References Cited

U.S. PATENT DOCUMENTS

| | | | |
|---|---|---|---|
| 5,789,280 A | 8/1998 | Yokota | |
| 6,348,729 B1 | 2/2002 | Li et al. | |
| 6,818,973 B1 | 11/2004 | Foster | |
| 6,995,459 B2 | 2/2006 | Lee et al. | |
| 7,193,298 B2 | 3/2007 | Hong et al. | |
| 7,211,471 B1 | 5/2007 | Foster | |
| 7,456,053 B2 | 11/2008 | Lee et al. | |
| 2005/0098863 A1 | 5/2005 | Kim | |
| 2009/0072365 A1* | 3/2009 | Tay et al. | 257/676 |
| 2009/0085181 A1 | 4/2009 | Advincula, Jr. et al. | |
| 2009/0243054 A1* | 10/2009 | Yeung et al. | 257/666 |
| 2010/0001384 A1 | 1/2010 | Bathan et al. | |

* cited by examiner

*Primary Examiner* — Caridad M Everhart
(74) *Attorney, Agent, or Firm* — Mikio Ishimaru

(57) ABSTRACT

A method of manufacture of an integrated circuit die packaging system includes: providing a lead frame having a die attach paddle, an isolated pad, and a connector; attaching an integrated circuit die to the die attach paddle and the connector; forming an encapsulation over the integrated circuit die, the connector, the die attach paddle, and the isolated pad; and singulating the connector and the die attach paddle whereby the isolated pads are electrically isolated.

9 Claims, 9 Drawing Sheets ified, including: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

INTEGRATED CIRCUIT PACKAGING SYSTEM WITH ISOLATED PADS AND METHOD OF MANUFACTURE THEREOF

CROSS-REFERENCE TO RELATED APPLICATION(S)

This application claims the benefit of U.S. Provisional Patent Application Ser. No. 61/057,203 filed May 30, 2008, and the subject matter thereof is incorporated herein by reference thereto.

TECHNICAL FIELD

The present invention relates generally to an integrated circuit packaging system, and more particularly to a system with isolated pads.

BACKGROUND ART

Increased miniaturization of components, greater packaging density of an integrated circuit die ("IC"), higher performance, and lower cost are ongoing goals of the computer industry. IC package technology continues advances in miniaturization to increase density of integrated circuit or semiconductor components within these packages. The miniaturization of IC packages decreases sizes of products made from these packages in response to continually increasing demands for information and communication products in ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, a large-scale integrated circuit ("LSI") within an IC package is required to be made smaller and thinner. The LSI package configurations that house and protect the LSI are required to be made smaller and thinner as well.

Many conventional packages for integrated circuits, semiconductors or chips are of the type where a semiconductor die is molded into a package with a resin, such as an epoxy molding compound. These packages have a lead frame whose leads are projected from the package body to provide a path for signal transfer between the die and external devices.

Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages thus manufactured are then mounted by matching and soldering the external leads or contact pads of the package to a matching pattern on a circuit board to enable power and signal input/output ("I/O") operations between the semiconductor devices in the packages and the circuit board.

Different challenges arise from increased function integration and miniaturization. For example, a semiconductor product having increased function may be smaller but still require a large number of inputs/outputs (I/O). The size reduction increases the I/O density or decreases the I/O pitch for the integrated circuit die package and its respective integrated circuit die carriers.

The ever-increasing I/O density trend presents a myriad of manufacturing problems. Some of these problems reside in the IC die manufacturing realm, such as fine pitch connections and reliability of these connections. Others problems involve mounting these increase I/O density integrated circuit dies on carriers for packaging. Yet other problems reside in the realm of the printed circuit board or the system board that receives the integrated circuit die package having the fine pitch I/O or a large number of I/Os in an ever-shrinking space.

Thus, a need still remains for an integrated circuit die package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit die packaging system including: providing a lead frame having a die attach paddle, an isolated pad, and a connector; attaching an integrated circuit die to the die attach paddle and the connector; forming an encapsulation over the integrated circuit die, the connector, the die attach paddle, and the isolated pad; and singulating the connector and the die attach paddle whereby the isolated pads are electrically isolated.

The present invention provides an integrated circuit die packaging system including: a die attach paddle; an isolated pad adjacent the die attach paddle; a connector near the isolated pad and the die attach paddle; an integrated circuit die attached to the die attach paddle and the connector; an encapsulation over the integrated circuit die, the connector, the die attach paddle, and the isolated pad with the connector, the die attach paddle, and the isolated pads electrically isolated having sides of the die attach paddle with characteristics of a formation process.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
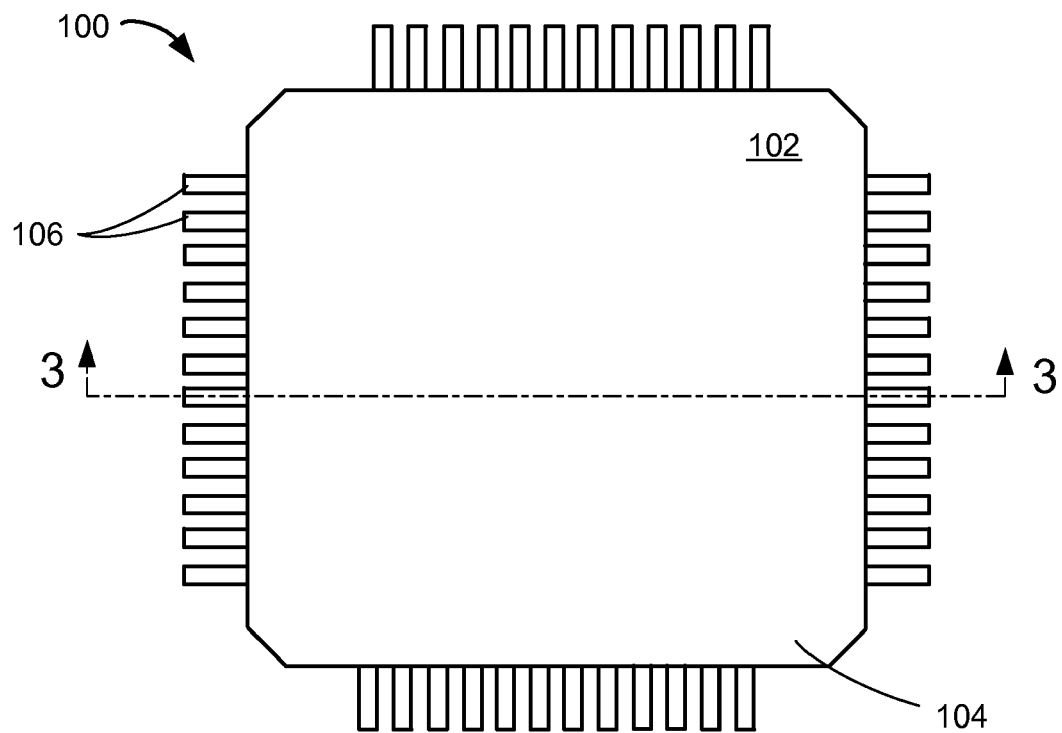
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the die attach paddle, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts an encapsulation 102, such as an epoxy molded compound, having an encapsulation first side 104. External connectors 106 are partially exposed and extended peripherally from the encapsulation 102. The external connectors 106, for example, can be leads, external connections, or external conductors, for the integrated circuit packaging system 100 in a quad flat package type.

It has been discovered that the integrated circuit packaging system 100 provides significantly increased input/output capacity, multiple chip integration, or ease of assembly without increasing thickness of packages. This aspect can assist in integration of dissimilar technologies such as memory and sequential logic integrated circuits. In addition the integrated circuit packaging system 100 limits or eliminates cutting pads preventing delamination associated with sawing packages.

Figure 2:
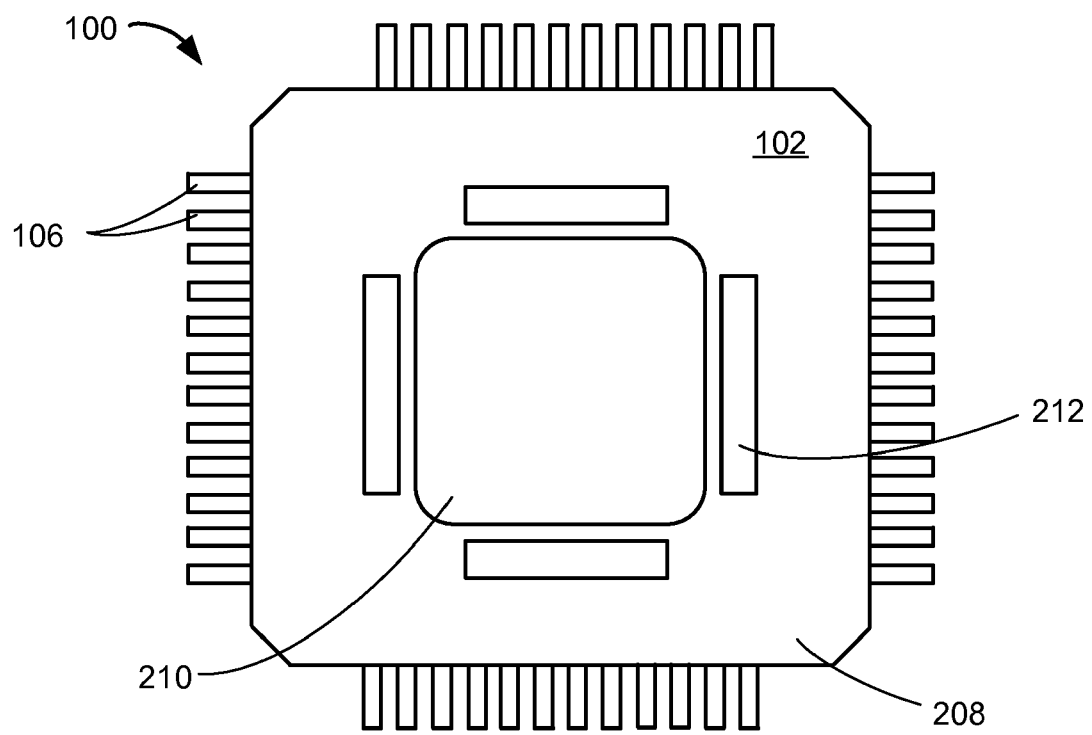
FIG. 2 is a bottom plan view of the integrated circuit packaging system.

Referring now to FIG. 2, therein is shown a bottom plan view of the integrated circuit packaging system 100. The bottom view depicts the encapsulation 102 with an encapsulation second side 208. The external connectors 106 are partially exposed and extending peripherally from the encapsulation second side 208. The bottom view also depicts a die attach paddle 210, such as a conductive or non-conductive platform onto which an integrated circuit can be mounted. The encapsulation second side 208 can provide the die attach paddle 210 substantially exposed or substantially covered.

Isolated pads 212, such as die attach pad extensions, elongated pads, an array of pads, or staggered pads, can be formed of conductive materials such as copper or tungsten. The isolated pads 212 can be formed having a length approximately the same as a length of the die attach paddle 210 and preferably having a width less than half of the length. The side along the length of the isolated pads 212 can preferable be substantially parallel to an adjacent or a facing side of the die attach paddle 210. The isolated pads 212 can be substantially surrounded by and formed within a periphery of the encapsulation 102. A side of the isolated pads 212 can be substantially exposed from the encapsulation second side 208.

For example, the isolated pads 212 can be formed to provide connection regions similar to the die attach paddle 210 for down bonds or ground connections. Forming the isolated pads 212 having a spacing or separation from the die attach paddle 210 eliminates delamination of the die attach paddle 210 from singulation or separation processes such as sawing, cutting, or etching.

The isolated pads 212 can be electrically isolated from the die attach paddle 210 without applying separation or singulation processes to sides of the die attach paddle 210 whereby the die attach paddle 210 maintains characteristics of a formation process. The structural integrity of sides the die attach paddle 210 from the formation process can be preserved without applying further separation or singulation processes to the sides for isolating additional pads or pad segments.

It has been discovered that the integrated circuit packaging system 100 provides more signal I/O pins or potential reduction of package size, similar thermal performance to exposed-pad quad flat pack packages, or optimized PCB routing.

Figure 3:
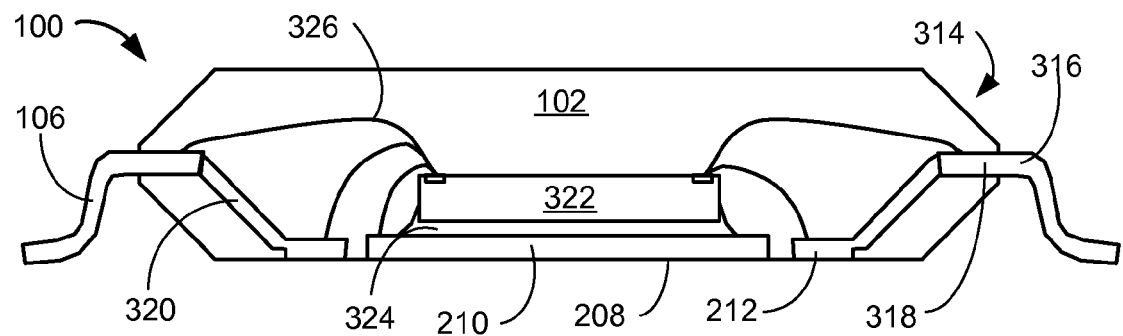
FIG. 3 is a cross-sectional view of the integrated circuit packaging system taken along line 3-3 of FIG. 1.

Referring now to FIG. 3, therein is shown a cross-sectional view of the integrated circuit packaging system 100 taken along line 3--3 of FIG. 1. The cross-sectional view depicts the encapsulation 102 with the external connectors 106 extending from a lateral side 314 of the encapsulation 102.

The external connectors 106 are connected to dam bars 316, such as a temporary metal bar used to inhibit the flow of plastic or provide a substantially fixed location for components during the molding process. The dam bars 316 can be connected to internal connectors 318, such as leads, external connections, or external conductors, covered by the encapsulation 102.

The dam bars 316 can also be connected to the isolated pads 212 by fused connectors 320, such as bars of conductive material such as copper or tungsten. Preferably the fused connectors 320 are down set, such as extending from an upper location to a lower location, so that the fused connectors 320 can connect to the isolated pads 212. For example, the isolated pads 212 can be formed in a different plane and not coplanar to a plane of the dam bars 316 whereby a down set of the fused connectors 320 extends from an upper plane of the dam bars 316 to a lower plane of the isolated pads 212. The isolated pads 212 can be formed adjacent or facing the die attach paddle 210.

The cross-sectional view further depicts an integrated circuit die 322, such as a microchip or a flip chip, attached to the die attach paddle 210 with an adhesive 324. Electrical interconnects 326, such as bond wires or ribbon bonds, electrically attach the integrated circuit die 322, the die attach paddle 210, the isolated pads 212 and the internal connectors 318. It is understood that the isolated pads 212 can be electrically connected to various signals such as reference source, signals, power, or ground.

The encapsulation 102 covers the integrated circuit die 322 and the electrical interconnects 326. The encapsulation 102 can partially cover the die attach paddle 210 and the isolated pads 212 exposing a side of the die attach paddle 210 or the isolated pads 212 from the encapsulation second side 208. A removal process can be applied for separation or singulation of the isolated pads 212 and internal connectors 318 in the encapsulation 102 without the need for separation or singulation from the sides of the die attach paddle 210 and providing a significantly lower cost than equivalent laminate packages.

Figure 4:
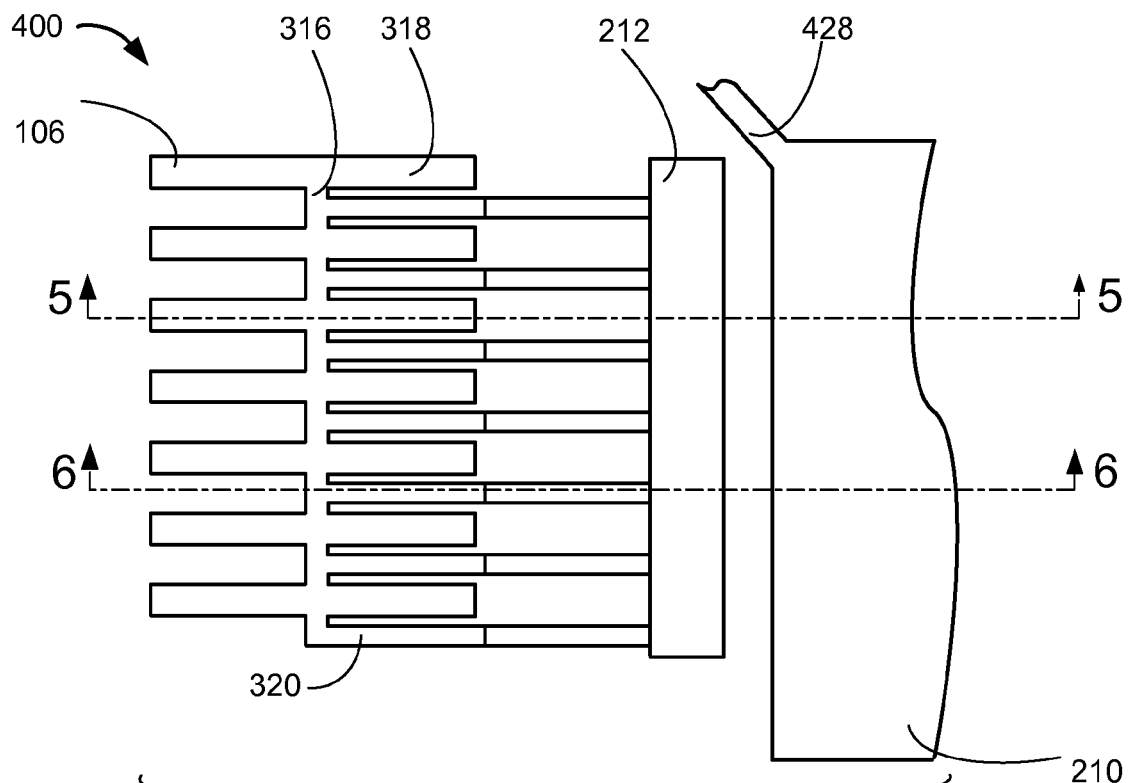
FIG. 4 is a top plan view of an integrated circuit packaging system in a frame formation phase of a second embodiment of the present invention.

Referring now to FIG. 4, therein is shown a top plan view of an integrated circuit packaging system 400 in a frame formation phase of a second embodiment of the present invention. A detailed portion of the integrated circuit packaging system 400 is shown for clarity. The top plan view depicts the dam bars 316 that can connect the external connectors 106 and the internal connectors 318. The dam bars 316 can also be connected to the isolated pads 212 by the fused connectors 320. The top plan view further depicts the die attach paddle 210 attached to a tie bar 428.

A lead frame 402 can include the die attach pad 210, the isolated pads 212, the tie bar 428, the internal connectors 318, the external connectors 106, and the dam bars 316. The lead frame 402 provides structural integrity and substantially fixed locations for the die attach pad 210, the isolated pads 212, the internal connectors 318, and the external connectors 106 during processing. The tie bar 428 and the dam bars 316 can be at least partially removed to provide the die attach pad 210, the isolated pads 212, the internal connectors 318, and the external connectors 106 separated or singulated.

The isolated pads 212 can be separated, isolated, or singulated from the internal connectors 318 and the external connectors 106 by removal of at least a portion of the dam bars 316. At least a portion of the dam bars 316 can be removed by removal processes such as cutting, sawing, etching, or other removal technologies without applying a separation process to the die attach paddle 210 thereby maintaining structural integrity of the die attach paddle 210 particularly edge regions.

Figure 5:
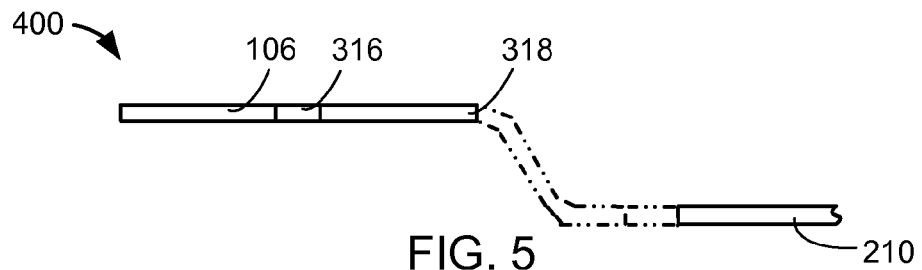
FIG. 5 is a cross-sectional view of the integrated circuit packaging system taken along line 5-5 of FIG. 4.

Referring now to FIG. 5, therein is shown a cross-sectional view of the integrated circuit packaging system 400 taken along line 5--5 of FIG. 4. The cross-sectional view depicts the dam bars 316 connecting the external connectors 106 and the internal connectors 318. For purposes of illustration, a plane of the die attach paddle 210 is depicted below a plane of the dam bars 316 although it is understood that the die attach paddle 210 and the dam bars 316 may be formed differently.

Figure 6:
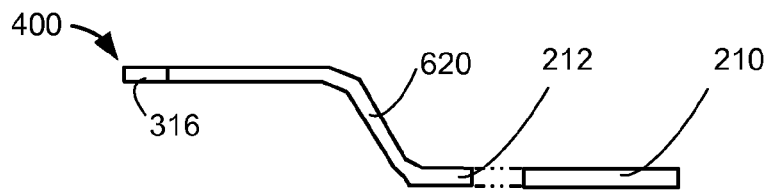
FIG. 6 is a cross-sectional view of the integrated circuit packaging system taken along line 6-6 of FIG. 4.

Referring now to FIG. 6, therein is shown is a cross-sectional view of the integrated circuit packaging system 400 taken along line 6--6 of FIG. 4. The cross-sectional view depicts the fused connectors 320 connecting the dam bars 316 with the isolated pads 212. The fused connectors 320 can be down set for connection to the isolated pads 212 having a side in a plane different or not coplanar to a plane of a side of the dam bars 316.

An attachment surface of the die attach paddle 210 is depicted having a plane of an attachment surface lower than a plane of the dam bars 316. Further, a plane of the attachment surface of the die attach paddle 210 is substantially coplanar with a plane of a connection surface of the isolated pads 212.

Figure 7:
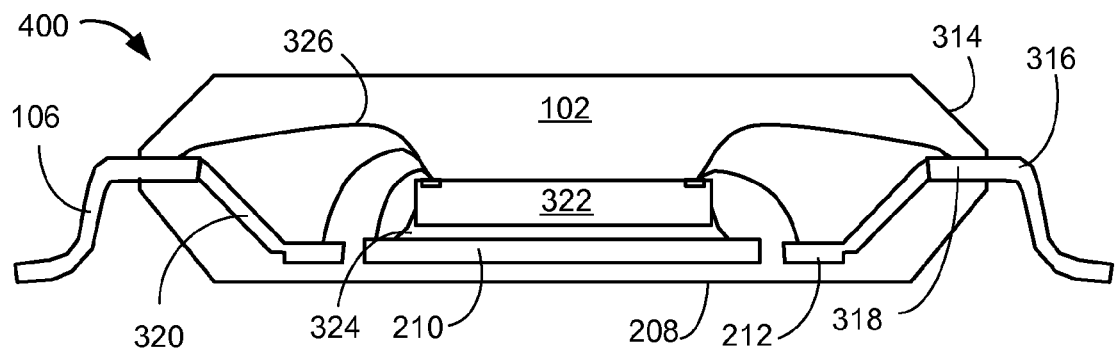
FIG. 7 is a cross-sectional view of an integrated circuit packaging system in a third embodiment of the present invention.

Referring now to FIG. 7, therein is shown a cross-sectional view of an integrated circuit packaging system 700 a third embodiment of the present invention. In a manner similar to the integrated circuit packaging system 100 of FIG. 3, the encapsulation 102 provides the external connectors 106 partially exposed and extended from the lateral side 314 of the encapsulation 102.

The dam bars 316 connect the external connectors 106 and the internal connectors 318, such as leads. The dam bars 316 are also connected to the isolated pads 212 by the fused connectors 320. Preferably the fused connectors 320 are down set so to connect the isolated pads 212 that are in a different plane and not coplanar with the dam bars 316. The isolated pads 212 are provided adjacent the die attach paddle 210.

The cross-sectional view further depicts the integrated circuit die 322 attached to the die attach paddle 210 with the adhesive 324. The electrical interconnects 326 can electrically connect and physically attach the integrated circuit die 322 to the die attach paddle 210, the isolated pads 212 and the internal connectors 318.

The encapsulation 102 covers the integrated circuit die 322, the electrical interconnects 326, the internal connectors 318, the fused connectors 320, the die attach paddle 210, and the isolated pads 212. The encapsulation second side 208 can substantially enclose and protect the die attach paddle 210 and the isolated pads 212.

Figure 8:
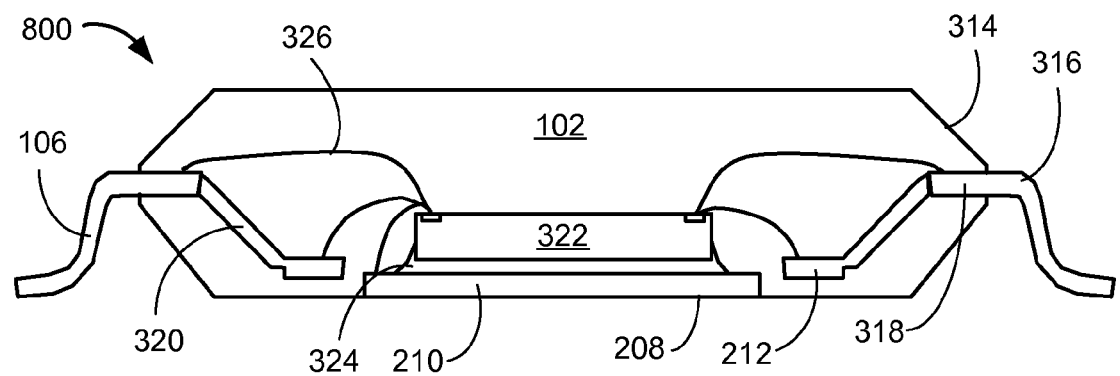
FIG. 8 is a cross-sectional view of an integrated circuit packaging system in a fourth embodiment of the present invention.

Referring now to FIG. 8, therein is shown a cross-sectional view of an integrated circuit packaging system 800 in a fourth embodiment of the present invention. The cross-sectional view depicts the encapsulation 102 with the external connectors 106 extending from the lateral side 314 of the encapsulation 102.

The dam bars 316 connect the external connectors 106 and the internal connectors 318. The dam bars 316 are also connected to the isolated pads 212 by the fused connectors 320. The isolated pads 212 are formed adjacent to the die attach paddle 210.

The cross-sectional view further depicts the integrated circuit die 322 attached to the die attach paddle 210 with the adhesive 324. The electrical interconnects 326 electrically connect and physically attach the integrated circuit die 322 to the die attach paddle 210, the isolated pads 212 and the internal connectors 318.

The encapsulation 102 covers the integrated circuit die 322, the electrical interconnects 326, the internal connectors 318, the fused connectors 320, and the isolated pads 212. The encapsulation 102 partially covers the die attach paddle 210, substantially exposing a side of the die attach paddle 210 from the encapsulation second side 208. The encapsulation second side 208 can substantially enclose and protect the isolated pads 212.

Figure 9:
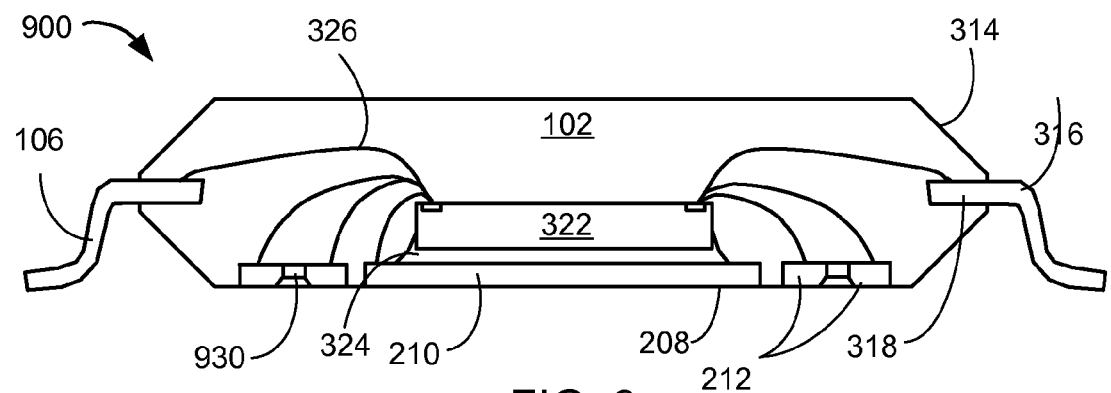
FIG. 9 is a cross-sectional view of an integrated circuit packaging system in a fifth embodiment of the present invention.

Referring now to FIG. 9, therein is shown a cross-sectional view of an integrated circuit packaging system 900 in a fifth embodiment of the present invention. The cross-sectional view depicts the encapsulation 102 having the external connectors 106 extending from the lateral side 314 of the encapsulation 102. The dam bars 316 connect the external connectors 106 and the internal connectors 318.

The cross-sectional view also depicts the isolated pads 212 formed adjacent the die attach paddle 210. The isolated pads 212 are connected to opposite sides of connecting bars 930 formed adjacent the die attach paddle 210. At least one of the isolated pads 212 can be formed facing a side of the die attach paddle 210. For purposes of illustration, two of the isolated pads 212 can be formed adjacent each side of the die attach paddle 210, although it is understood that any number or configuration of the isolated pads 212 may be formed.

The cross-sectional view further depicts the integrated circuit die 322 attached to the die attach paddle 210 with the adhesive 324. The electrical interconnects 326 electrically attach the integrated circuit die 322 to the die attach paddle 210, the isolated pads 212 and the internal connectors 318.

The encapsulation 102 covers the integrated circuit die 322, the internal connectors 318 and the electrical interconnects 326. The encapsulation 102 partially covers the die attach paddle 210, the isolated pads 212 and the connecting bars 930, substantially exposing a side of the die attach paddle 210 and the isolated pads 212 from the encapsulation second side 208. The encapsulation second side 208 can optionally provide a side of the connecting bars 930 substantially exposed.

Figure 10:
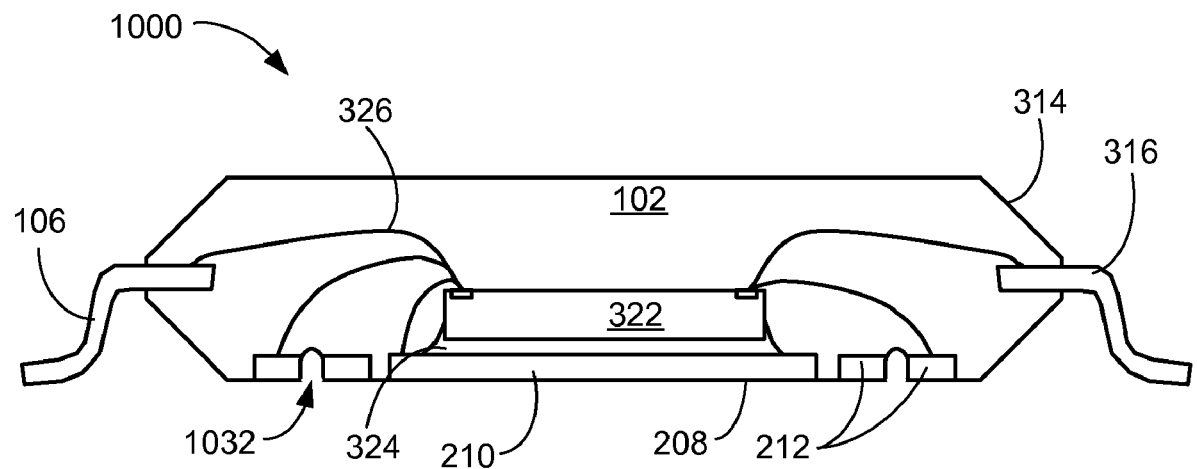
FIG. 10 is a cross-sectional view of an integrated circuit packaging system in a sixth embodiment of the present invention taken along line 10--10 of FIG. 11.
Figure 11:
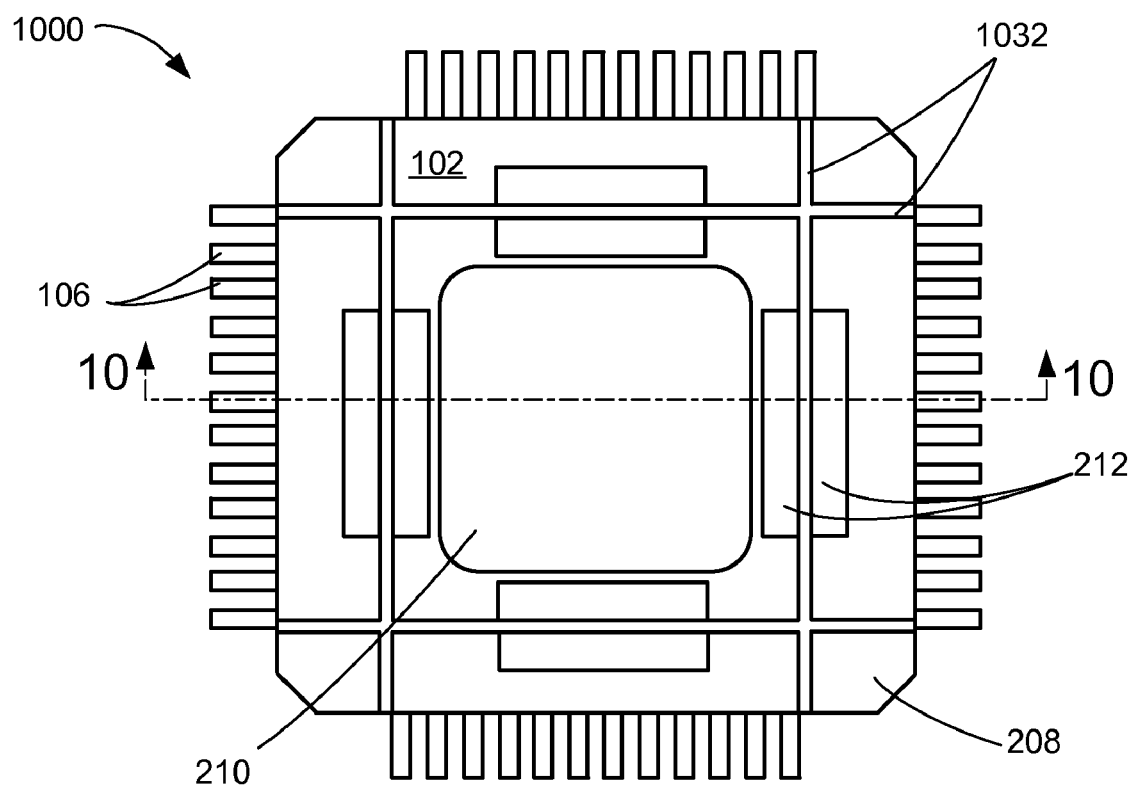
FIG. 11 is a bottom plan view of the integrated circuit packaging system.

Referring now to FIG. 10, therein is shown a cross-sectional view of an integrated circuit packaging system 1000 in a sixth embodiment of the present invention taken along line 10-10 of FIG. 11. The cross-sectional view depicts the encapsulation 102 with the external connectors 106 extending from the lateral side 314 of the encapsulation 102. The dam bars 316 connect the external connectors 106 and the internal connectors 318.

The cross-sectional view also depicts the isolated pads 212 formed adjacent to the die attach paddle 210. The isolated pads 212 are separated by a cavity 1032, such as a cut line, saw channel, with a process such as partial sawing, chemical etching or laser drilling. The cavity 1032 and thereby the isolated pads 212 can be formed without the need for a removal process applied to the die attach paddle 210.

The cross-sectional view further depicts the integrated circuit die 322 attached to the die attach paddle 210 with the adhesive 324. The electrical interconnects 326 electrically attach the integrated circuit die 322 to the die attach paddle 210, the isolated pads 212 and the internal connectors 318.

The encapsulation 102 covers the integrated circuit die 322, the internal connectors 318 and the electrical interconnects 326. The encapsulation 102 partially covers the die attach paddle 210 and the isolated pads 212 substantially exposing a side of the die attach paddle 210 and the isolated pads 212, from the encapsulation second side 208.

Referring now to FIG. 11, therein is shown a bottom plan view of the integrated circuit packaging system 1000. The bottom view depicts the encapsulation 102 with the encapsulation second side 208. The external connectors 106 are partially exposed and extending peripherally from the encapsulation 102. The isolated pads 212 are provided having a spacing from the periphery of the encapsulation 102. The isolated pads 212 are separated by the cavity 1032. A side of the isolated pads 212 and the die attach paddle 210 are substantially exposed from the encapsulation second side 208.

Figure 12:
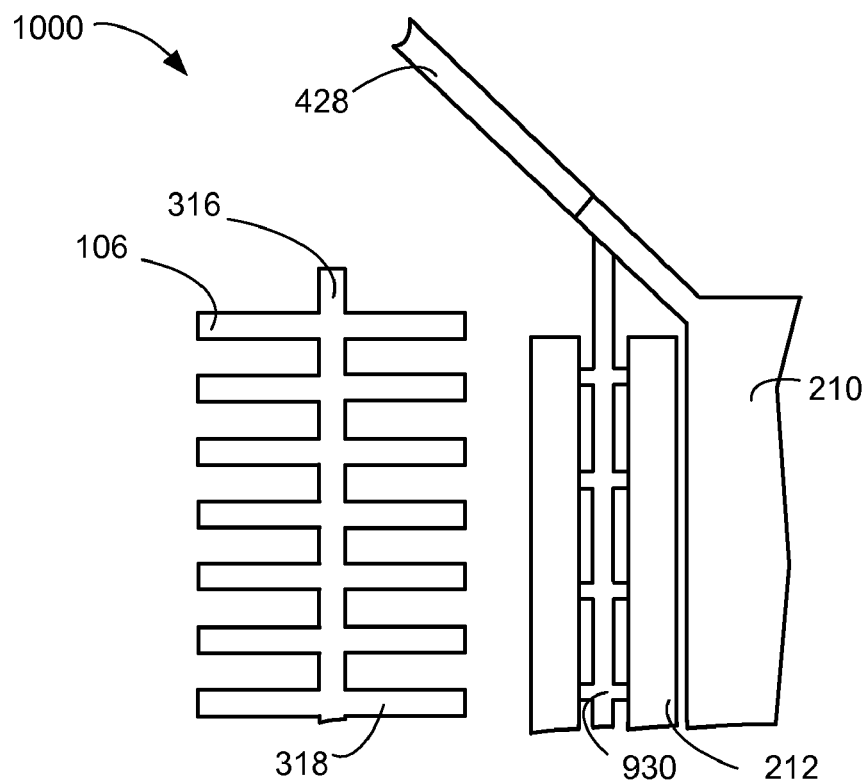
FIG. 12 is a top plan view of the integrated circuit packaging system in a frame formation phase.

Referring now to FIG. 12, therein is shown a top plan view of the integrated circuit packaging system 1000 in a frame formation phase. A detailed portion of the integrated circuit packaging system 1000 is shown for clarity. The top plan view depicts the dam bars 316 that connect the external connectors 106 and the internal connectors 318. The top plan view further depicts the die attach paddle 210 attached to the tie bar 428. The tie bar 428 is connected to the connecting bars 930 which connect the isolated pads 212.

The connecting bars 930 and a portion of the tie bar 428 can be thinned by processing such as half etching, stamping, or other thinning process. The thinned portions of the connecting bars 930 and the tie bar 428 can provide separation, isolation, or singulation of the isolated pads 212 without applying a removal process to the die attach paddle 210 thereby maintaining structural integrity of the die attach paddle 210 particularly edge regions.

Figure 13:
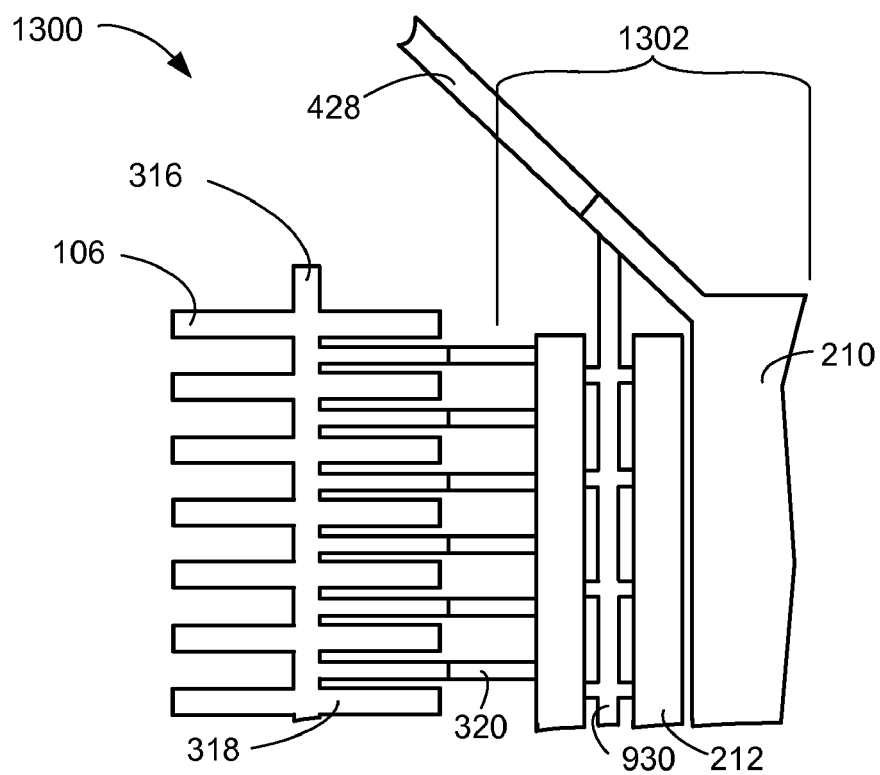
FIG. 13 is a top plan view of an integrated circuit packaging system in a frame formation phase of a seventh embodiment of the present invention.

Referring now to FIG. 13, therein is shown a top plan view of an integrated circuit packaging system 1300 in a frame formation phase of a seventh embodiment of the present invention. The integrated circuit packaging system 1300 can include a down set portion 1302. The die attach paddle 210, the isolated pads 212, a portion of the tie bar 428, and a portion of the fused connectors 320 can be formed in one or more plane planes below a plane of the internal connectors 318 or the external connectors 106.

The connecting bars 930 and a portion of the tie bar 428 can be thinned by processing such as half etching, stamping, or other thinning process. The thinned portions of the connecting bars 930 and the tie bar 428 can provide separation, isolation, or singulation of the isolated pads 212 without applying a removal process to the die attach paddle 210 thereby maintaining structural integrity of the die attach paddle 210 particularly edge regions.

The isolated pads 212 can further be separated, isolated, or singulated from the internal connectors 318 and the external connectors 106 by removal of at least a portion of the dam bars 316. At least a portion of the dam bars 316 can be removed by removal processes such as cutting, sawing, etching, or other removal technologies.

The top plan view depicts the dam bars 316 that connect the external connectors 106 and the internal connectors 318. The top plan view further depicts the die attach paddle 210 attached to the tie bar 428. The tie bar 428 is connected to the connecting bars 930 which connect the isolated pads 212. The fused connectors 320 connects the isolated pads 212, provided between the die attach paddle 210 and the internal connectors 318, to the dam bars 316.

Figure 14:
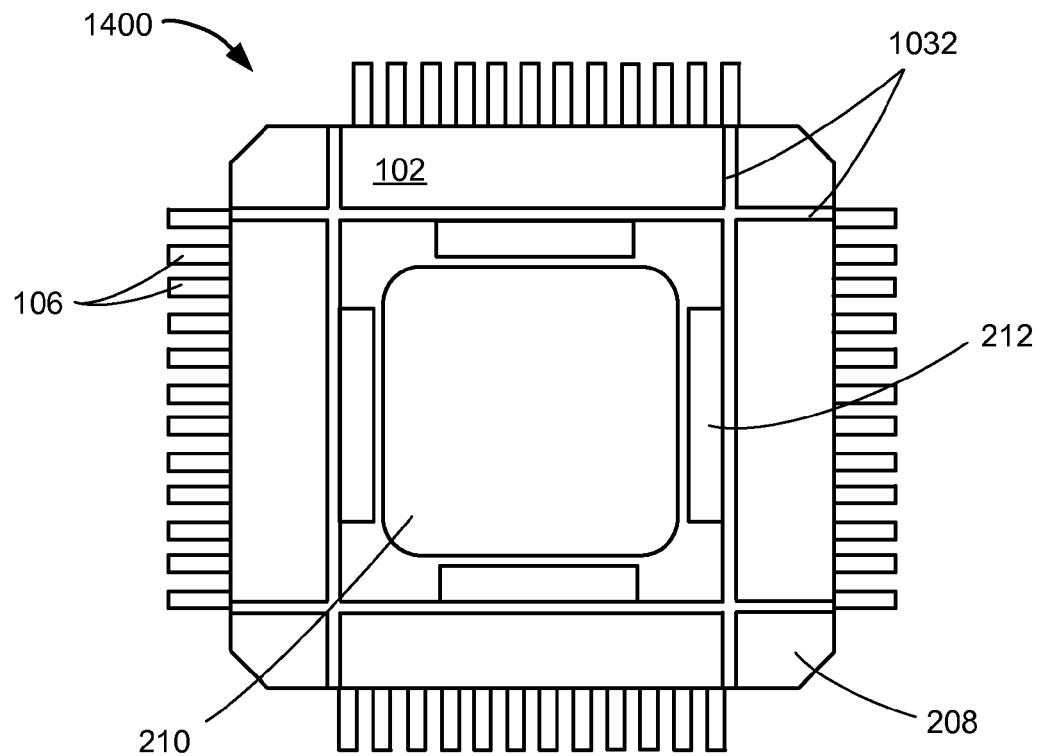
FIG. 14 is a bottom plan view of an integrated circuit packaging system in an eighth embodiment of the present invention.

Referring now to FIG. 14 therein is shown a bottom plan view of an integrated circuit packaging system 1400 in an eighth embodiment of the present invention. The integrated circuit packaging system 1400 can include the isolated pads 212 formed inside the cavity 1032 whereby the cavity 1032 is on a side of the isolated pads 212 opposite the die attach paddle 210. A side along the length of the isolated pads 212 can be adjacent or facing the die attach paddle 210. The cavity 1032 can provide electrical isolation of the isolated pads 212 and the die attach paddle 210.

The bottom view depicts the encapsulation 102 with the encapsulation second side 208. The external connectors 106 are partially exposed and extending peripherally from the encapsulation 102. The bottom view also depicts a side of the die attach paddle 210 substantially exposed from the encapsulation second side 208. The isolated pads 212 are provided away from the periphery of the encapsulation 102 between the cavity 1032 and the die attach paddle 210. The isolated pads 212 can be substantially exposed from the encapsulation second side 208.

Figure 15:
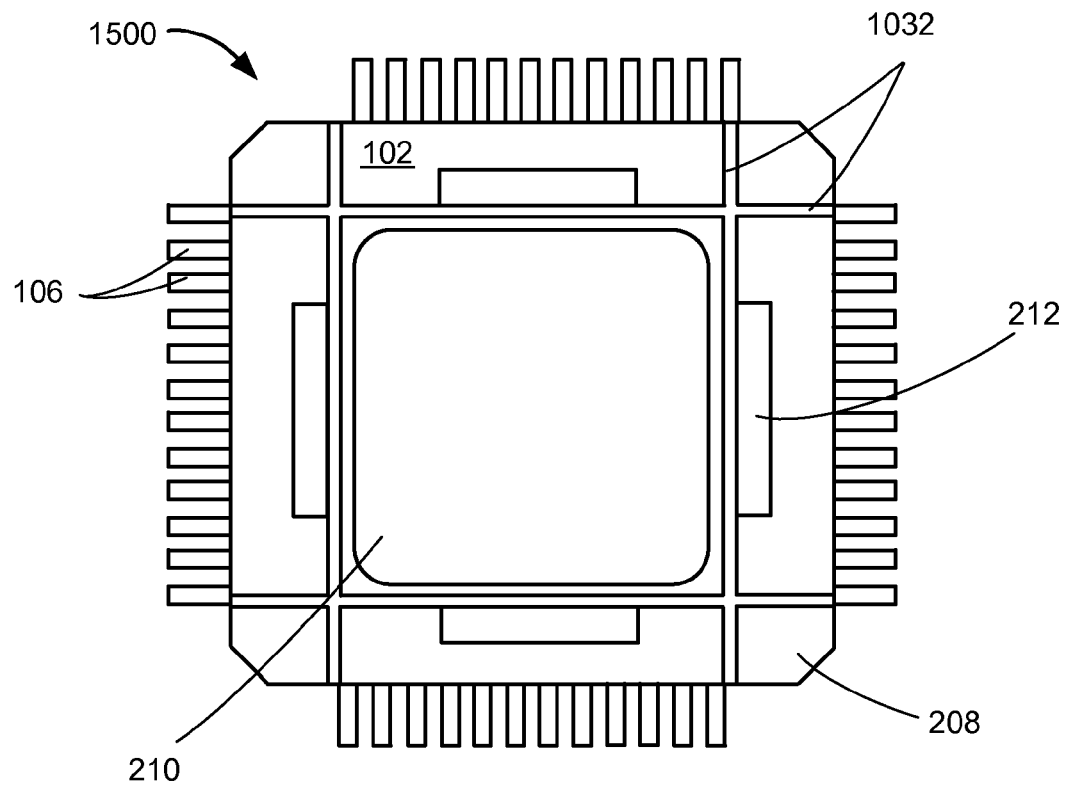
FIG. 15 is a bottom plan view of an integrated circuit packaging system in a ninth embodiment of the present invention.

Referring now to FIG. 15, therein is shown a bottom plan view of an integrated circuit packaging system 1500 in a ninth embodiment of the present invention. The integrated circuit packaging system 1500 can include the isolated pads 212 formed outside the cavity 1032 whereby the cavity 1032 is between a side of the isolated pads 212 and a side of the die attach paddle 210. A side along the length of the isolated pads 212 can be adjacent or facing the cavity 1032 and the die attach paddle 210. The cavity 1032 can intervene between the isolated pads 212 and the die attach paddle 210 and provide electrical isolation of the isolated pads 212 and the die attach paddle 210.

The bottom view depicts the encapsulation 102 with the encapsulation second side 208. The external connectors 106 are partially exposed and extending peripherally from the encapsulation 102. The bottom view also depicts the die attach paddle 210 exposed from the encapsulation second side 208. The isolated pads 212 are provided away from the periphery of the encapsulation 102 between the external connectors 106 and the cavity 1032. The isolated pads 212 are exposed from the encapsulation second side 208.

Figure 16:
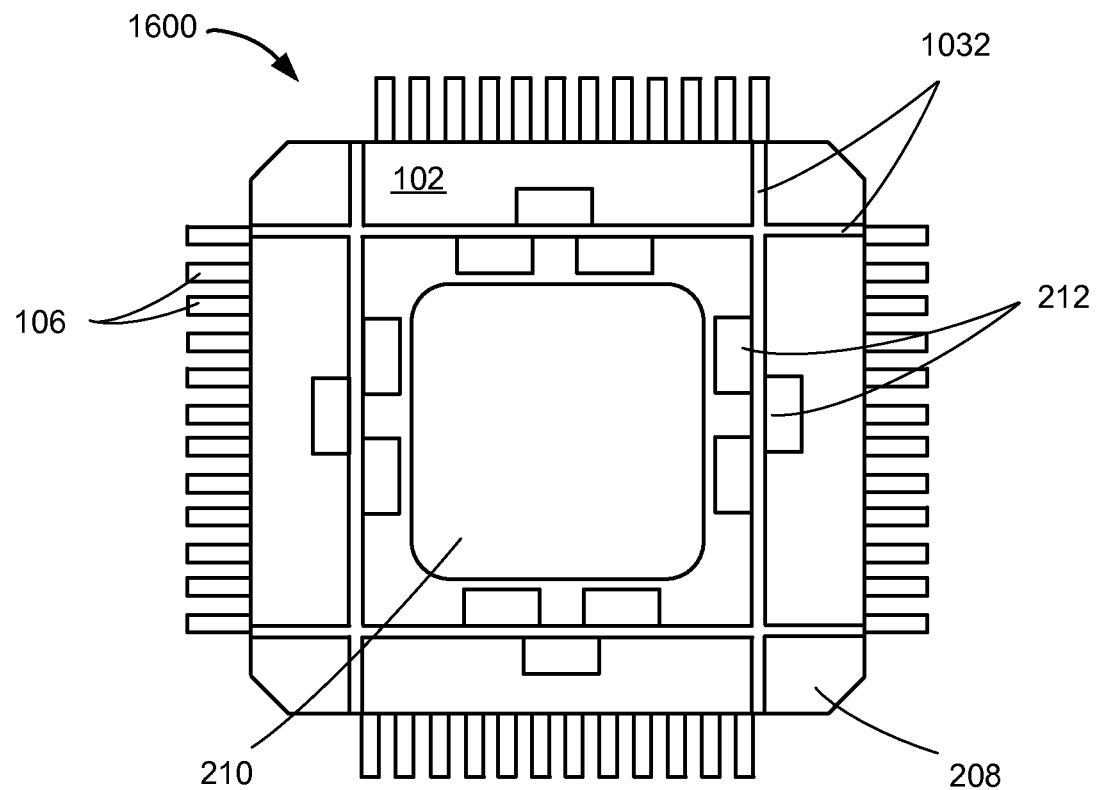
FIG. 16 is a bottom plan view of an integrated circuit packaging system in a tenth embodiment of the present invention.

Referring now to FIG. 16, therein is shown a bottom plan view of an integrated circuit packaging system 1600 in a tenth embodiment of the present invention. The integrated circuit packaging system 1600 can include the isolated pads 212 formed on opposite sides of the cavity 1032 whereby the cavity 1032 is between the isolated pads 212. A side along the length of the isolated pads 212 can be adjacent or facing the die attach paddle 210. A portion of the cavity 1032 can have a side adjacent or facing a side of the die attach paddle 210 without the cavity 1032 intervening. The cavity 1032 can intervene between the isolated pads 212 to provide electrical isolation of the isolated pads 212 and the die attach paddle 210.

The bottom view depicts the encapsulation 102 with the encapsulation second side 208. The external connectors 106 are partially exposed and extending peripherally from the encapsulation 102. The bottom view also depicts the die attach paddle 210 exposed from the encapsulation second side 208. The isolated pads 212 are provided away from the periphery of the encapsulation 102. The isolated pads 212 are provided on either side of the cavity 1032 in a staggered formation.

Figure 17:
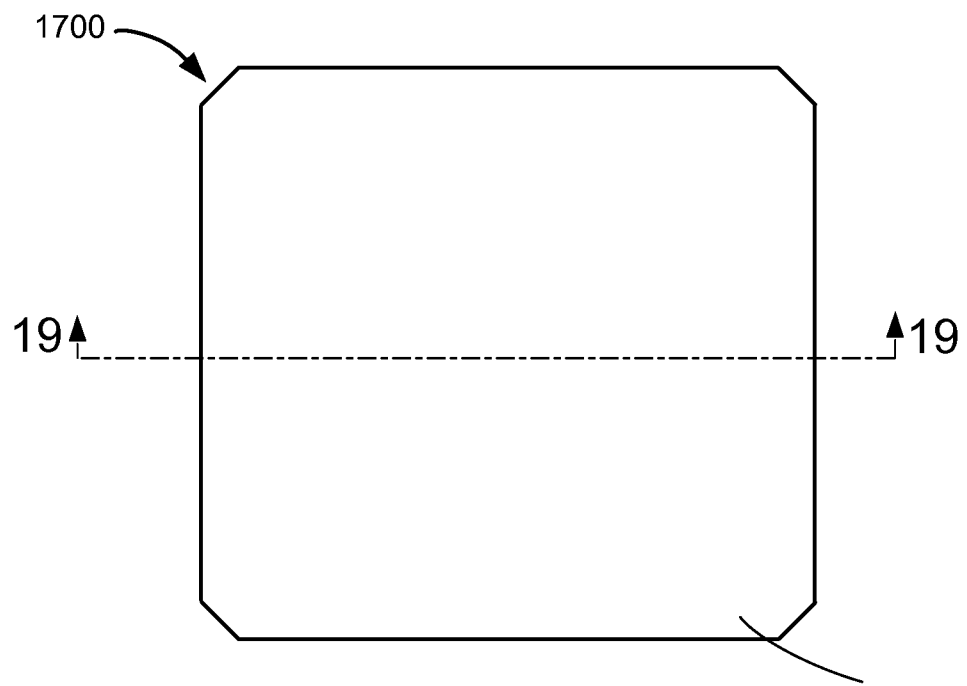
FIG. 17 is a top plan view of an integrated circuit packaging system in an eleventh embodiment of the present invention.

Referring now to FIG. 17, therein is shown a top plan view of an integrated circuit packaging system 1700 in an eleventh embodiment of the present invention. The top view depicts the encapsulation 102 having the encapsulation first side 104. The encapsulation 102 covers and protects the isolated pads 212 and the die attach paddle. For purposes of illustration, the encapsulation 102 is shown in a shape of a square although it is understood that the encapsulation 102 may be of any shape or size.

Figure 18:
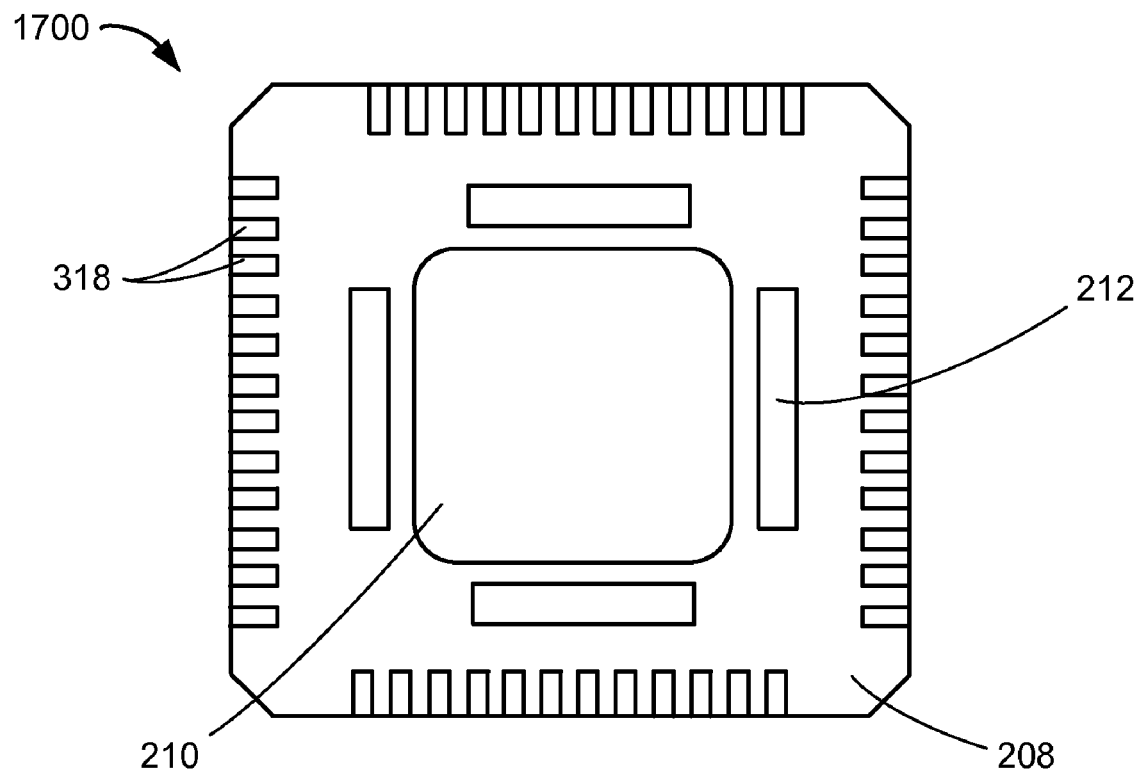
FIG. 18 is a bottom plan view of the integrated circuit packaging system.

Referring now to FIG. 18, therein is shown a bottom plan view of the integrated circuit packaging system 1700. The bottom view depicts the encapsulation 102 with the encapsulation second side 208. The internal connectors 318 are partially exposed from the encapsulation second side 208, but do not extend peripherally from an outer extent of the encapsulation 102. Thus, the internal connectors 318 can have an external edge substantially exposed but not extending from an edge of the encapsulation 102. The internal connectors 318, for example, can be leads, external connections, or external conductors, for the integrated circuit packaging system 1700 in a quad flat no leads package type.

The bottom view also depicts a die attach paddle 110 exposed from the encapsulation second side 208. The isolated pads 212 are provided away from the periphery of the encapsulation 102. The isolated pads 212 are exposed from the encapsulation second side 208.

Figure 19:
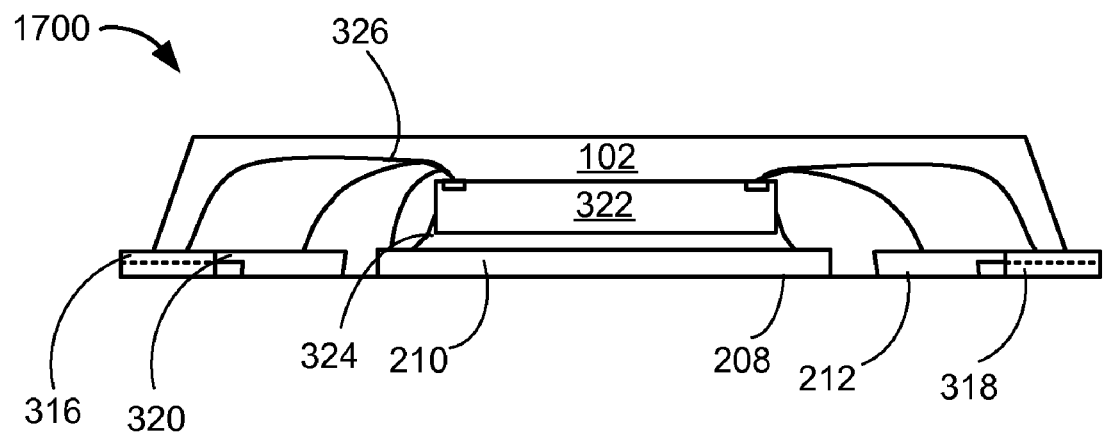
FIG. 19 is a cross-sectional view of the integrated circuit packaging system taken along line 19-19 of FIG. 17.

Referring now to FIG. 19, therein is shown a cross-sectional view of the integrated circuit packaging system 1700 taken along line 19-19 of FIG. 17. The cross-sectional view depicts the encapsulation 102 having the internal connectors 318 exposed from the encapsulation second side 208. The internal connectors 318 are connected to the dam bars 316. The dam bars 316 are connected to the isolated pads 212 by the fused connectors 320. The fused connectors 320 are coplanar with the dam bars 316 and the isolated pads 212. The isolated pads 212 are formed adjacent to the die attach paddle 210.

The cross-sectional view further depicts the integrated circuit die 322 attached to the die attach paddle 210 with the adhesive 324. The electrical interconnects 326 electrically attach the integrated circuit die 322 to the die attach paddle 210, the isolated pads 212 and the internal connectors 318. The encapsulation 102 covers the integrated circuit die 322 and the electrical interconnects 326. The encapsulation 102 partially covers the die attach paddle 210, the isolated pads 212 and the internal connectors 318 exposing the die attach paddle 210, the isolated pads 212 and the internal connectors 318 from the encapsulation second side 208.

In a manner similar to the integrated circuit packaging system 400, the isolated pads 212 can be separated, isolated, or singulated from the internal connectors 318 and the external connectors 106 by removal of at least a portion of the dam bars 316. At least a portion of the dam bars 316 can be removed by removal processes such as cutting, sawing, etching, or other removal technologies without applying a separation process to the die attach paddle 210 thereby maintaining structural integrity of the die attach paddle 210 particularly edge regions.

Figure 20:
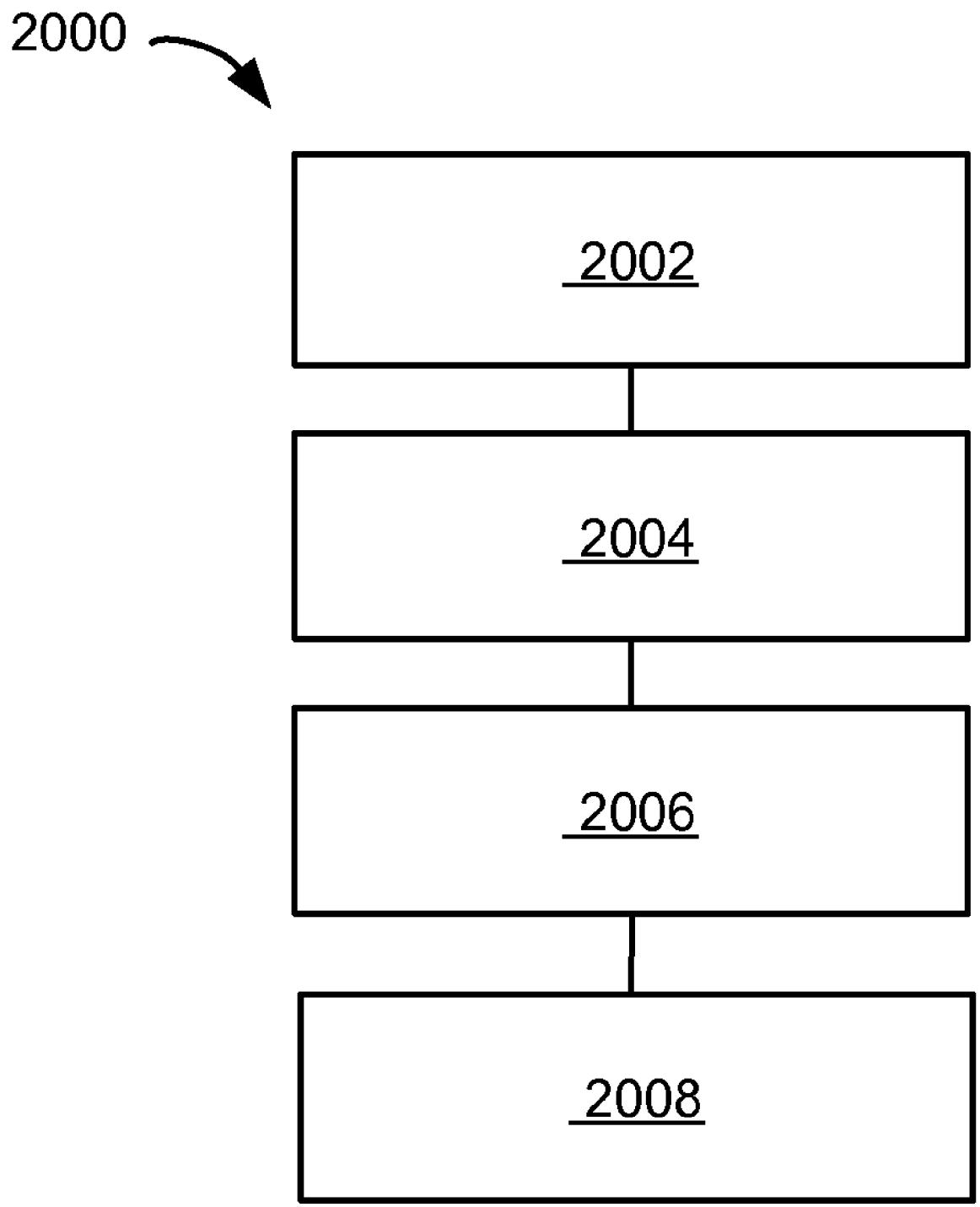
FIG. 20 is a flow chart of a method of manufacture of an integrated circuit packaging system in a further embodiment of the present invention.

Referring now to FIG. 20, therein is shown a flow chart of a method 2000 of manufacture of an integrated circuit packaging system 100 in a further embodiment of the present invention. The method 2000 includes: providing a lead frame having a die attach paddle, an isolated pad, and a connector in a block 2002; attaching an integrated circuit die to the die attach paddle and the connector in a block 2004; forming an encapsulation over the integrated circuit die, the connector, the die attach paddle, and the isolated pad a block 2006; and singulating the connector and the die attach paddle whereby the isolated pads are electrically isolated in a block 2008.

Thus, it has been discovered that the integrated circuit die packaging system of the present invention furnishes important and heretofore unknown and unavailable solutions, capabilities, and functional aspects for aspects for improving yield, increasing reliability, and reducing cost of integrated circuit packages with leaded configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a lead frame having a die attach paddle, an isolated pad, and a connector;
   attaching an integrated circuit die to the die attach paddle and the connector;
   forming an encapsulation over the integrated circuit die, the connector, the die attach paddle, and the isolated pad; and
   singulating the connector and the die attach paddle includes removing a portion of a fused connector attached to the isolated pad and a dam bar whereby the isolated pads are electrically isolated.

2. The method as claimed in claim 1 wherein singulating the connector and the die attach paddle includes removing a portion of a tie bar attached to the isolated pad and the die attach paddle.

3. The method as claimed in claim 1 wherein singulating the connector and the die attach paddle includes removing a portion of a connecting bar attached to the isolated pad and a second isolated pad.

4. The method as claimed in claim 1 wherein singulating the connector and the die attach paddle includes removing a portion of a fused connector attached to the isolated pad, the isolated pad formed with a down set from the fused connector.

5. A method of manufacture of an integrated circuit packaging system comprising:
   providing a lead frame having a die attach paddle, an isolated pad, and a connector;
   mounting an integrated circuit die to the die attach paddle;
   attaching an electrical interconnect to the integrated circuit die, the isolated pad, and the connector;
   forming an encapsulation over the integrated circuit die, the connector, the die attached paddle, and the isolated pad; and
   singulating the connector and the die attach paddle includes removing a portion of a fused connector attached to the isolated pad and a dam bar whereby the isolated pads are electrically isolated.

6. The method as claimed in claim 5 wherein forming an encapsulation includes forming an encapsulation providing a side of the isolated pad substantially exposed.

7. The method as claimed in claim 5 wherein forming an encapsulation includes forming an encapsulation providing a side of the die attach pad substantially exposed.

8. The method a claimed in claim 5 wherein forming an encapsulation includes forming an encapsulation providing a side of the isolated pad substantially exposed and a side of the die attach pad substantially exposed.

9. The method as claimed in claim 5 further comprising forming a second isolated pad separated from the isolated pad by a cavity.

\* \* \* \* \*